United States Patent
Wu et al.

(10) Patent No.: US 9,568,624 B2
(45) Date of Patent: Feb. 14, 2017

(54) METHOD FOR PREDICTING ELECTROMAGNETIC RADIATION CHARACTERISTICS, COMPUTER-READABLE RECORDING MEDIUM AND SIMULATOR

(71) Applicant: National Taiwan University, Taipei (TW)

(72) Inventors: Tzong-Lin Wu, Taipei (TW); Hung-Chuan Chen, Taipei (TW)

(73) Assignee: National Taiwan University, Taipei (TW)

( * ) Notice: Subject to any disclaimer, the term of this patent is extended or adjusted under 35 U.S.C. 154(b) by 247 days.

(21) Appl. No.: 14/601,251

(22) Filed: Jan. 21, 2015

(65) Prior Publication Data

US 2016/0170047 A1 Jun. 16, 2016

(30) Foreign Application Priority Data

Dec. 11, 2014 (TW) .............................. 103143277 A

(51) Int. Cl.
  *G01R 23/04* (2006.01)
  *G01T 7/00* (2006.01)
  *G01R 31/28* (2006.01)

(52) U.S. Cl.
  CPC ................ *G01T 7/00* (2013.01); *G01R 31/28* (2013.01)

(58) Field of Classification Search
  CPC ... G01R 33/02; G01R 33/0206; G01R 31/002; G01R 31/28; G01N 27/02; G06F 17/50; G06F 17/5036; G06F 17/5045; G06F 17/5063
  See application file for complete search history.

(56) References Cited

U.S. PATENT DOCUMENTS

| 7,120,551 B2 * | 10/2006 | Hirano | ................ G06F 17/5036 702/117 |
| 8,484,598 B2 | 7/2013 | Osaka et al. | |
| 2006/0173662 A1 * | 8/2006 | Kazama | ............. G06F 17/5018 703/4 |

(Continued)

FOREIGN PATENT DOCUMENTS

| CN | 101061639 | 10/2007 |
| CN | 102057552 | 5/2011 |

(Continued)

OTHER PUBLICATIONS

"Office Action of Taiwan Counterpart Application", issued on Oct. 21, 2015, p. 1-p. 3, in which the listed references were cited.

*Primary Examiner* — Minh N Tang
(74) *Attorney, Agent, or Firm* — Jianq Chyun IP Office

(57) ABSTRACT

A method for predicting electromagnetic radiation characteristics, a computer-readable recording medium and a simulator are provided. The method includes the steps of obtaining a plurality of first radiation currents in an equivalent circuit model of an electronic component, calculating a radiation resistance according to the first radiation currents, inserting the radiation resistance into the equivalent circuit model, and then obtaining a plurality of second radiation currents in the equivalent circuit model, and predicting electromagnetic radiation characteristics of the electronic component according to the second radiation currents.

19 Claims, 6 Drawing Sheets

(56) References Cited

U.S. PATENT DOCUMENTS

| | | | |
|---|---|---|---|
| 2009/0102470 A1* | 4/2009 | Kiso | G01R 33/02 |
| | | | 324/227 |
| 2011/0126030 A1 | 5/2011 | Nakamura et al. | |
| 2011/0251832 A1 | 10/2011 | Schoeberl et al. | |
| 2014/0074440 A1 | 3/2014 | Yamagajo et al. | |
| 2014/0224993 A1 | 8/2014 | Noh et al. | |

FOREIGN PATENT DOCUMENTS

| CN | 102983635 | 3/2013 |
|---|---|---|
| CN | 103210620 | 7/2013 |

* cited by examiner

METHOD FOR PREDICTING ELECTROMAGNETIC RADIATION CHARACTERISTICS, COMPUTER-READABLE RECORDING MEDIUM AND SIMULATOR

CROSS-REFERENCE TO RELATED APPLICATION

This application claims the priority benefit of Taiwan application serial no. 103143277, filed on Dec. 11, 2014. The entirety of the above-mentioned patent application is hereby incorporated by reference herein and made a part of this specification.

BACKGROUND OF THE INVENTION

1. Field of the Invention

The invention generally relates to a technique for predicting electromagnetic radiation characteristics, in particular, to a method, a computer-readable recording medium and a simulator for predicting electromagnetic radiation characteristics.

2. Description of Related Art

Presently, electromagnetic radiation characteristics such as an electromagnetic radiation power generated by an electronic component or a radiation pattern of an antenna structure in an electronic system may only be obtained via an electromagnetic full-wave solver at a product designing stage. Since algorithms such as a finite element method (FEM), a finite-difference time-domain (FDTD) method, or a method of moment (MOM) are adopted by the electromagnetic full-wave solver, intensive and massive mathematical computation is involved, which is very time-consuming.

Furthermore, when signal integrity analysis or power integrity analysis is performed on a system, an eye pattern of the system architecture may be analyzed to obtain an overall performance of the system through the use of time-domain circuit software. However, most existing electromagnetic full-wave solvers may only provide an analytic result of an electronic component in a frequency domain. The file type of the analytic result may not be compatible with other circuit architectures in the time-domain circuit software, and may thus create difficulties in analysis or may even provide incorrect results.

SUMMARY OF THE INVENTION

Accordingly, the invention is directed to a method, a computer-readable recording medium and a simulator for predicting electromagnetic radiation characteristics, which greatly reduce the time required for predicting electromagnetic radiation characteristics of an electronic component.

The invention is directed to a method for predicting electromagnetic radiation characteristics. The method includes the steps of obtaining a plurality of first radiation currents in an equivalent circuit model of an electronic component, calculating a radiation resistance according to the first radiation currents, inserting the radiation resistance into the equivalent circuit model, and then obtaining a plurality of second radiation currents in the equivalent circuit model, and predicting electromagnetic radiation characteristics of the electronic component according to the second radiation currents.

The invention is also directed to a computer-readable recording medium storing a computer program. When an electronic device loads and executes the computer program, the aforesaid method for predicting electromagnetic radiation characteristics is performed.

The invention is further directed to a simulator including a processor and a storage device. The processor executes the aforesaid method for predicting electromagnetic radiation characteristics. The storage device is coupled to the processor and stores the equivalent circuit model, the first radiation currents, the radiation resistance, and the second radiation currents.

In view of the foregoing, the invention is able to construct an equivalent circuit model compatible with circuit analysis software for an electronic component, and such model also describes electromagnetic radiation characteristics of the electronic component. The invention may rapidly predict the electromagnetic radiation characteristics of the electronic component, whose efficiency is superior to that of a conventional electromagnetic full-wave solver.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
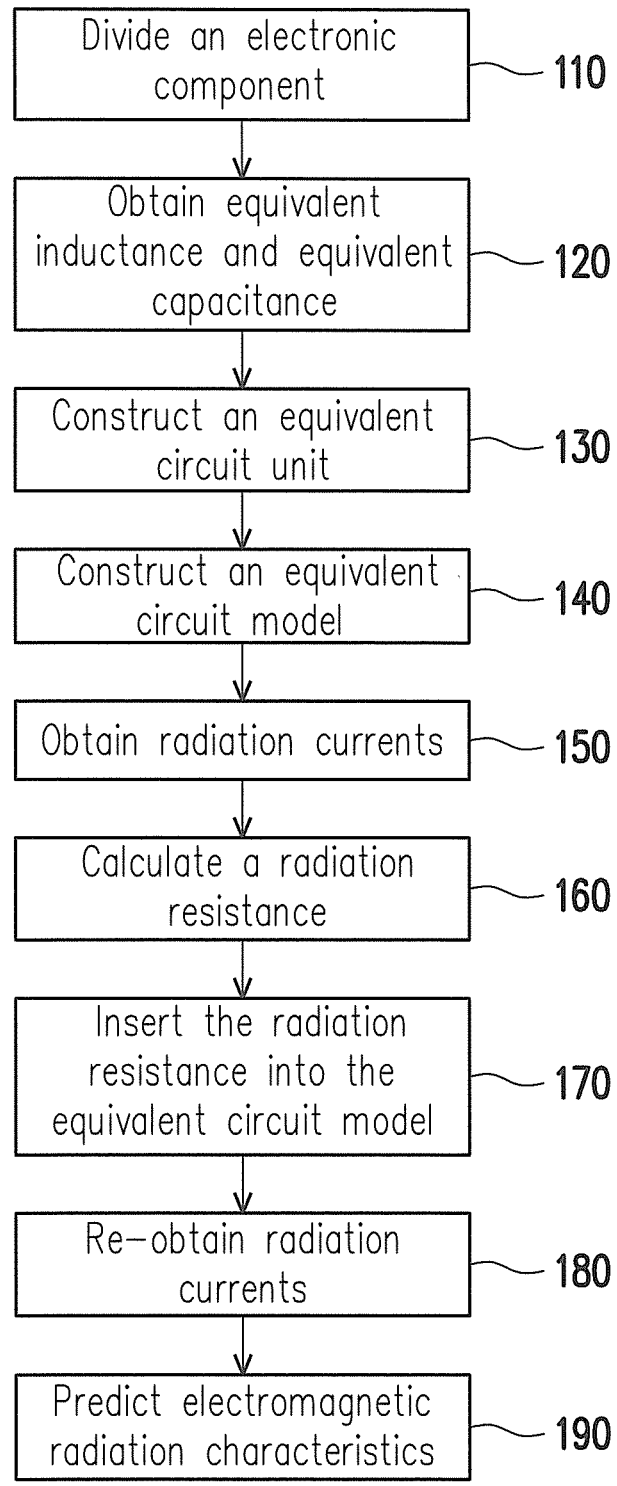
FIG. 1 illustrates a method for predicting electromagnetic radiation characteristics according to an embodiment of the invention.

Reference will now be made in detail to the present embodiments of the invention, examples of which are illustrated in the accompanying drawings. Wherever possible, the same reference numbers are used in the drawings and the description to refer to the same or like parts.

FIG. 1 illustrates a flowchart of a method for predicting electromagnetic radiation characteristics. Such method may be adopted to predict electromagnetic radiation characteristics of an electronic component. The electromagnetic radiation characteristics may include either or both of a total radiated power and a radiation pattern. The electronic component may be any circuit, any electronic device, or any element thereof. The electronic component may also be an integrated circuit, a printed circuit board, or an antenna in a wireless communication system.

Figure 2:
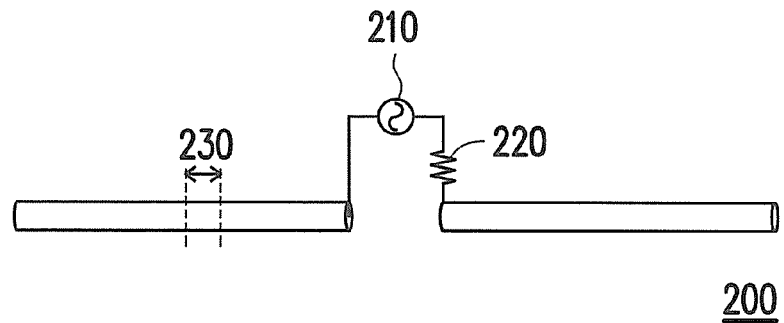
FIG. 2 illustrates a schematic diagram of a half-wave-length dipole antenna according to an embodiment of the invention.

In an embodiment of the invention, the aforesaid electronic component is a half-wavelength dipole antenna. FIG. 2 illustrates a schematic diagram of a half-wavelength dipole antenna 200 of the embodiment. A voltage source 210 may stimulate radiation of the antenna 200. Electrical impedance 220 corresponds to a source impedance of the voltage source 210.

Hereafter, the antenna 200 may serve as the electronic component for illustrating the flow of the method of FIG. 1. In Step 110, the electronic component may be divided into a plurality of parts, where a size of each of the parts may be a preset proportion of a guide wavelength corresponding to the maximum operating frequency of the antenna 200 (e.g. one-tenth of the guide wavelength corresponding to the maximum operating frequency). FIG. 2 illustrates a part 230 of the antenna 200. The antenna 200 may be divided into a plurality of parts based on the size of the part 230.

In Step 120, equivalent inductance(s) and equivalent capacitance(s) of each of the parts are obtained. The aforesaid equivalent inductance is an equivalent inductance with a return current at infinity, and the aforesaid equivalent capacitance is an equivalent capacitance with a zero potential at infinity. The equivalent inductance and the equivalent capacitance may be obtained via calculation or a lookup table.

Figure 3:
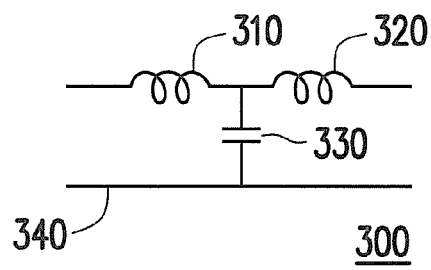
FIG. 3 illustrates a schematic diagram of an equivalent circuit unit according to an embodiment of the invention.
Figure 4:
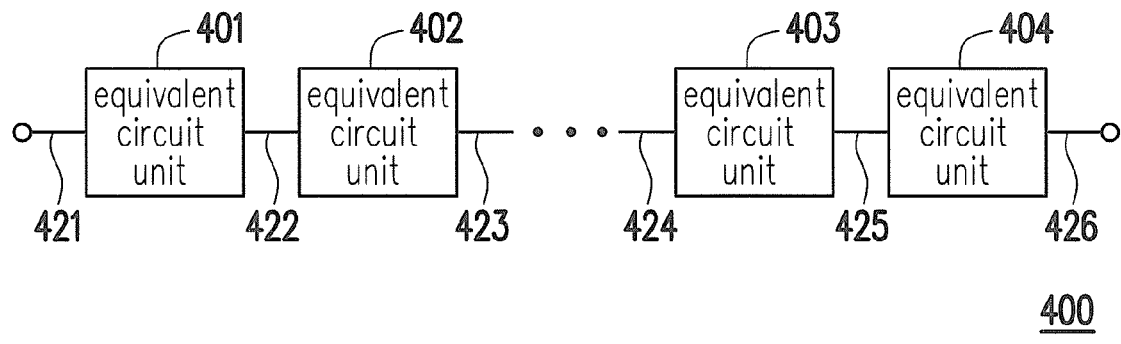
FIG. 4 illustrates a schematic diagram of an equivalent circuit model according to an embodiment of the invention.

In Step 130, an equivalent circuit unit for each of the parts is constructed according to the corresponding equivalent inductance and the corresponding equivalent capacitance. For example, FIG. 3 illustrates an equivalent circuit unit 300 of the part 230 of the antenna 200. The equivalent circuit unit 300 is an equivalent circuit of the part 230, where an inductance 310 and an inductance 320 are equivalent inductances of the part 230, and a capacitance 330 is an equivalent capacitance of the part 230. A line segment 340 represents a zero potential at infinity. In Step 140, an equivalent circuit model of the electronic component is constructed by assembling the equivalent circuit units of all the parts. For example, FIG. 4 illustrates an equivalent circuit model 400 of the antenna 200 formed by serially connecting a plurality of equivalent circuit units 401-404. Each of the equivalent circuit units 401-404 is the same as the equivalent circuit unit 300.

Next, in Step 150, a plurality of radiation currents are obtained in the equivalent circuit model of the electronic component so as to obtain a distribution of the radiation currents in the electronic component. Currents within a general electronic component may be classified into radiation currents and transmission-line mode currents. There exists a corresponding return current for a transmission-line mode current within the same electronic component, and thus no radiation is present. On the other hand, no corresponding return current exists for a radiation current within the same electronic component. The corresponding return current is assumed to be at infinity, and thus the radiation current may cause radiation. Hence, only the radiation currents are considered in the method of FIG. 1, where the transmission-line mode currents are not taken into account. A radiation current may also be referred to as a common-mode current when it corresponds to a single-ended transmission line.

A plurality of locations may be selected within the equivalent circuit model of the electronic component to obtain the radiation currents, and one of the radiation currents may be obtained at each of the locations. For example, locations 421-426 illustrated in FIG. 4 may be set as the locations to obtain the aforesaid radiation currents. The locations 421-426 are outside of the equivalent circuit units 401-404 in the present embodiment, and yet, the radiation currents may also be obtained from inside of the equivalent circuit units 401-404 in another embodiment.

Figure 5:
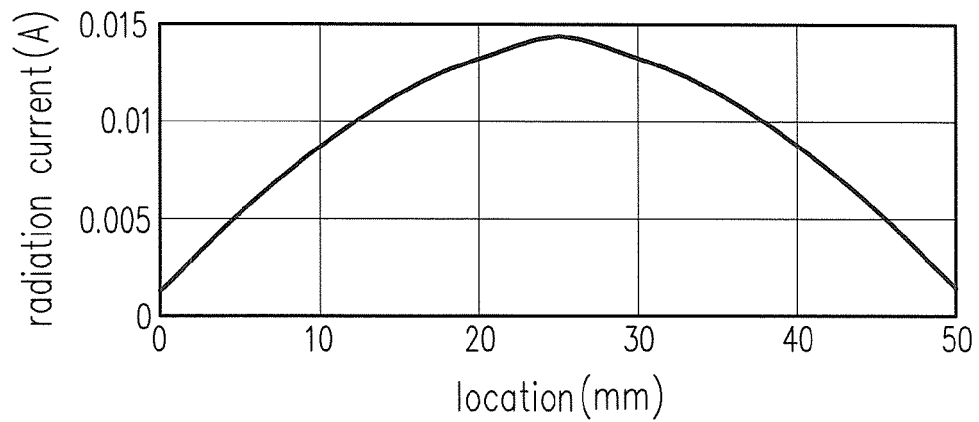
FIG. 5 illustrates a distribution of radiation currents according to an embodiment of the invention.

The aforesaid radiation currents may be obtained via physical measurement, model analysis, or computer simulation on the equivalent circuit model. Take the antenna 200 as an example. After the metal coupling effect and the discontinuity effect of the antennas respectively on the two sides of the antenna 200 are considered, the amount of the radiation currents distributed at each location in the antenna 200 may be determined. As illustrated in FIG. 5, the horizontal axis represents different locations, from the left end to the right end, of the antenna 200. The radiation currents obtained in Step 150 are distributed as illustrated in FIG. 5.

Next, in Step 160, according to the radiation currents obtained in Step 150, a radiation resistance of the electronic component may be calculated based on the following Eq. (1)-(6):

$$P = \int_S (\hat{E} \times \hat{H}^*) dS = \frac{1}{2\eta_0} \int_S |\hat{E}|^2 dS \tag{1}$$

$$\hat{E} = -j\omega \hat{A} \tag{2}$$

$$\hat{A} = \frac{e^{-jkr}}{4\pi\mu_0^{-1} r} \int_V J(\xi, \eta, \zeta) e^{jkl} dV = \hat{A}_\theta + \hat{A}_\phi \tag{3}$$

$$\hat{A}_\theta = \frac{e^{-jkr}}{4\pi\mu_0^{-1} r} \int_V [\cos\theta\cos\phi J_x(\xi, \eta, \zeta) + \cos\theta\sin\phi J_y(\xi, \eta, \zeta) - \sin\theta J_z(\xi, \eta, \zeta)] e^{jkl} dV \tag{4}$$

$$\hat{A}_\phi = \frac{e^{-jkr}}{4\pi\mu_0^{-1} r} \int_V [-\sin\phi J_x(\xi, \eta, \zeta) + \cos\phi J_y(\xi, \eta, \zeta)] e^{jkl} dV \tag{5}$$

$$R_A = \frac{2P}{|J(x, y, z)|^2} \tag{6}$$

In Eq. (1), P denotes the total radiated power of the electronic component. The integral symbol with S represents a surface integration at the surface of a sphere at infinity. $\hat{E}$ and $\hat{H}$ respectively denote an electric field and a magnetic field radiated by the electronic component. $\eta_0$ denotes the intrinsic impedance at free space, where $\eta_0$ is a physics constant and is approximately 377 ohm.

In Eq. (2), j represents the imaginary part of a complex number. ω denotes an operating angular frequency of the electronic component. $\hat{A}$ denotes a magnetic potential of the electronic component.

In Eq. (3), e represents Euler's number. k represents the propagation constant of electromagnetic waves in the air. r denotes the distance between the surface S of the sphere and the origin of the coordinate system. In other words, r represents the distance of the aforesaid infinity. $\mu_0$ represents the magnetic permeability. The integral symbol with V represents a volume integration of the radiation currents in the electronic component. $J(\xi,\eta,\zeta)$ denotes the distribution of the radiation currents in the electronic component. $\xi$, $\eta$, and $\zeta$ denotes coordinates in a three-dimensional coordinate system corresponding to the origin of the coordinate system. Since the currents are directional, $J(\xi,\eta,\zeta)$ in Eq. (4) and Eq. (5) may be decomposed into three components, $J_x(\xi,\eta,\zeta)$, $J_y(\xi,\eta,\zeta)$, and $J_z(\xi,\eta,\zeta)$ respectively corresponding to the x-coordinates, y-coordinates and z-coordinates of a three-dimensional coordinate system. l can be obtained by the dot product of the position vector from the origin of the coordinate system to any point in the distribution of the radiation currents of the electronic component and the unit vector of the x, y, z-coordinates from the origin of the coordinate system. $\dot{A}_\theta$ and $\dot{A}_\phi$ respectively denote two components of the magnetic potential $\dot{A}$ with respect to the polar coordinates $\theta$ and $\phi$ on the surface S of the sphere, where the polar coordinates $\theta$ and $\phi$ are transformed from the x, y, z-coordinates.

The variables and constants in Eq. (4) and Eq. (5) have already been explained. $R_A$ in Eq. (6) denotes the radiation resistance of the electronic component.

Figure 6:
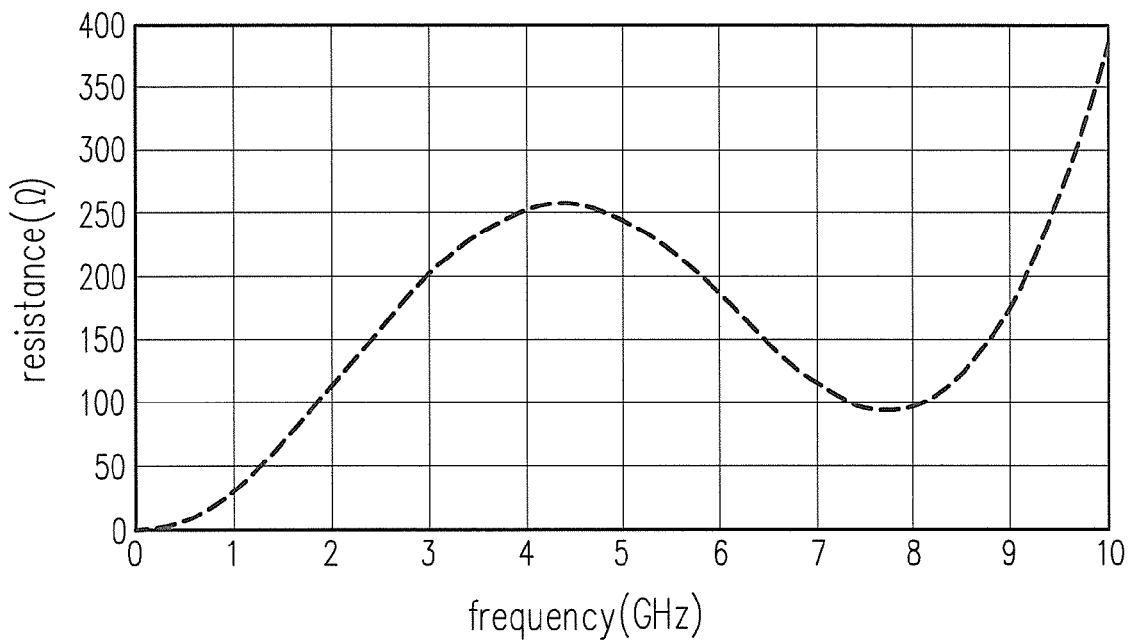
FIG. 6 illustrates a schematic diagram of a radiation resistance according to an embodiment of the invention.

In order to calculate the radiation resistance of the electronic component, the distribution of the radiation currents obtained in Step 150 may be substituted into $J_x(\xi,\eta,\zeta)$, $J_y(\xi,\eta,\zeta)$, and $J_z(\xi,\eta,\zeta)$ to obtain the magnetic potentials $\dot{A}_\theta$ and $\dot{A}_\phi$. Next, the magnetic potential A may be determined based on Eq. (3), and the electronic field $\dot{E}$ may be determined based on Eq. (2). The total radiated power P of the electronic component may be determined based on Eq. (1). The radiance resistance $R_A$ of the electronic component may be determined based on Eq. (6). The radiation current J(x,y,z) in Eq. (6) may be a radiation current selected from the radiation currents obtained in Step 150. All current values of the selected radiation current J(x,y,z) within the operating frequency range of the electronic component should be greater than zero to avoid the denominator being zero. As illustrated in FIG. 6, the radiation resistance at any specific location of the electronic component (i.e. the antenna 200) with respect to different operating frequencies may be calculated based on Eq. (1)-Eq. (6).

Next, in Step 170, the calculated radiation resistance $R_A$ may be inserted at the location in the equivalent circuit model of the electronic component where the selected radiation current J(x,y,z) is obtained. For example, assume that the selected radiation current J(x,y,z) is obtained at the location 422. The radiation resistance $R_A$ may be thus inserted at the same location 422 and the inserted radiation resistance $R_A$ is coupled between the equivalent circuit unit 401 and the equivalent circuit unit 402.

Next, in Step 180, a plurality of radiation currents may be re-obtained from the equivalent circuit model with the inserted radiation resistance $R_A$. The radiation currents in Step 180 may be obtained by using the same approach as in Step 150. Since the effect of the radiation resistance is neglected in the equivalent circuit model constructed in Step 130 and Step 140, the radiation currents obtained in Step 150 are incorrect. The actual radiation currents may be obtained in Step 180.

Figure 7:
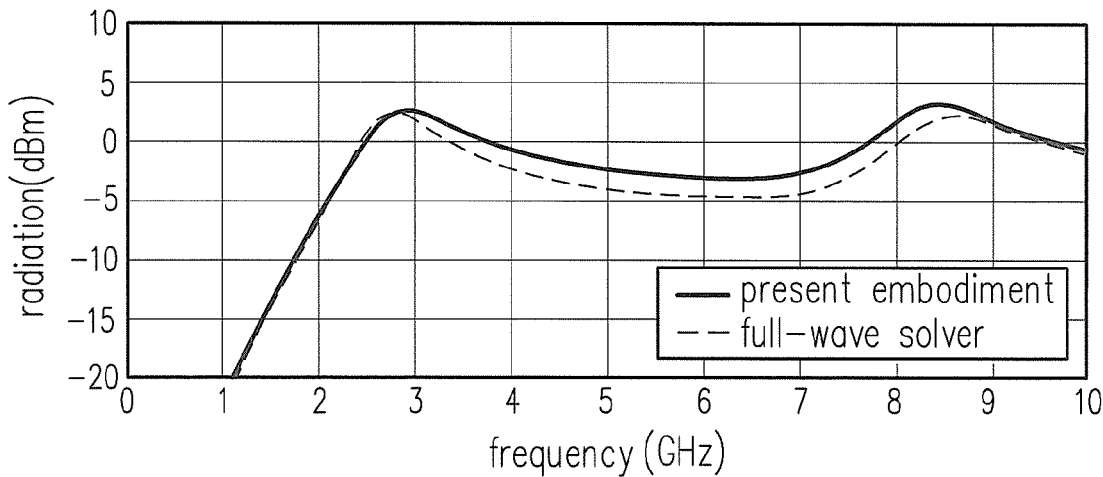
FIG. 7 illustrates a schematic diagram of a total radiated power according to an embodiment of the invention.
Figure 8:
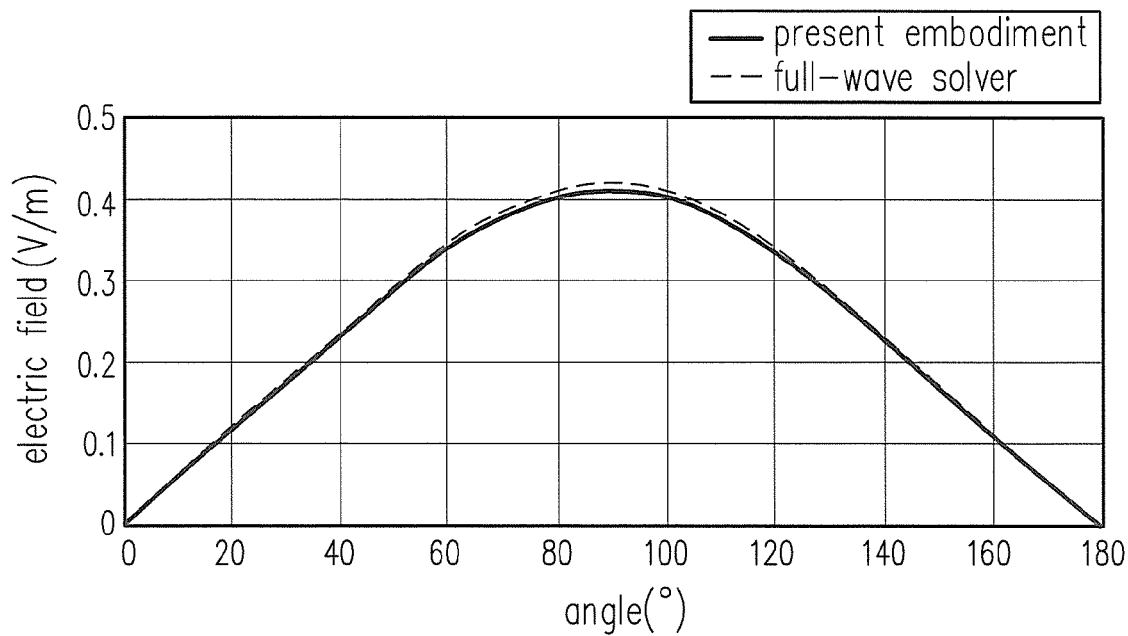
FIG. 8 illustrates a radiation pattern according to an embodiment of the invention.

Next, in Step 190, the electromagnetic radiation characteristics of the electronic component are predicted according to the radiation currents and Eq. (1)-(6). As previously mentioned, the electromagnetic radiation characteristics of the electronic component may include the total radiated power and the radiation pattern, where the total radiated power is the variable P in Eq. (1), and the radiation pattern is the electric field $\dot{E}$ in Eq. (2). FIG. 7 illustrates a schematic diagram of a total radiated power of the antenna 200 according to an embodiment of the invention. FIG. 8 illustrates a schematic diagram of a radiation pattern of the antenna 200 according to an embodiment of the invention. Both FIG. 7 and FIG. 8 illustrate predicted results of the method in FIG. 1 and a conventional electromagnetic full-wave solver. As illustrated in FIG. 7 and FIG. 8, the predicted results of the method in FIG. 1 are fairly close to the ones given by the conventional electromagnetic full-wave solver, and yet the computational speed of the method in FIG. 1 is dramatically faster. The prediction time of the method in FIG. 1 may be less than 1% of that of the conventional electromagnetic full-wave solver.

Figure 9:
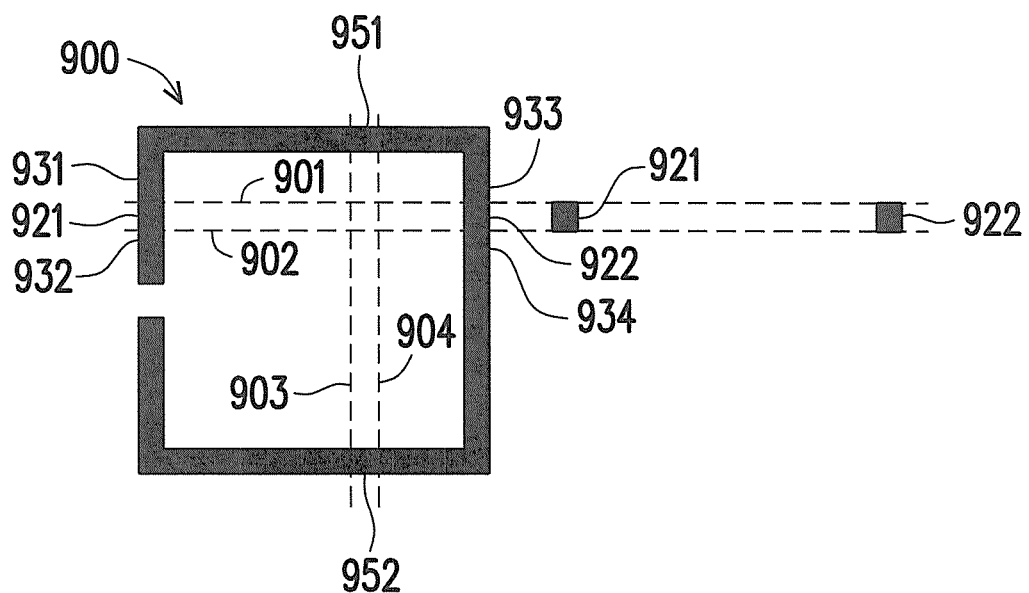
FIG. 9 illustrates a schematic diagram of a loop antenna according to an embodiment of the invention.
Figure 10:
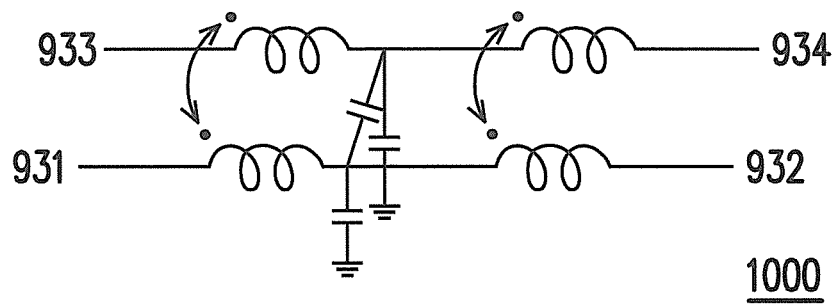
FIG. 10 illustrates a schematic diagram of an equivalent circuit unit according to an embodiment of the invention.

FIG. 9 illustrates a loop antenna 900 according to an embodiment of the invention. The method in FIG. 1 is also adapted to predict electromagnetic radiation characteristics of the antenna 900. The antenna 900 may thus be divided into a plurality of parts. For example, a segment 921 and a segment 922 segmented out by dashed lines 901-902 may be combined into a part, where an equivalent circuit unit 1000 of such part is illustrated in FIG. 10. A correspondence between the segments 921-922 and the equivalent circuit unit 1000 may be known according to reference points 931-934 in FIG. 9 and FIG. 10. The equivalent circuit unit 1000 includes electric field coupling and magnetic filed coupling between the segment 921 and the segment 922. Similarly, a segment 951 and a segment 952 segmented out by dashed lines 903-904 may be combined into another part, where an equivalent circuit unit of such part is the same as the equivalent circuit unit 1000 illustrated in FIG. 10.

Figure 11:
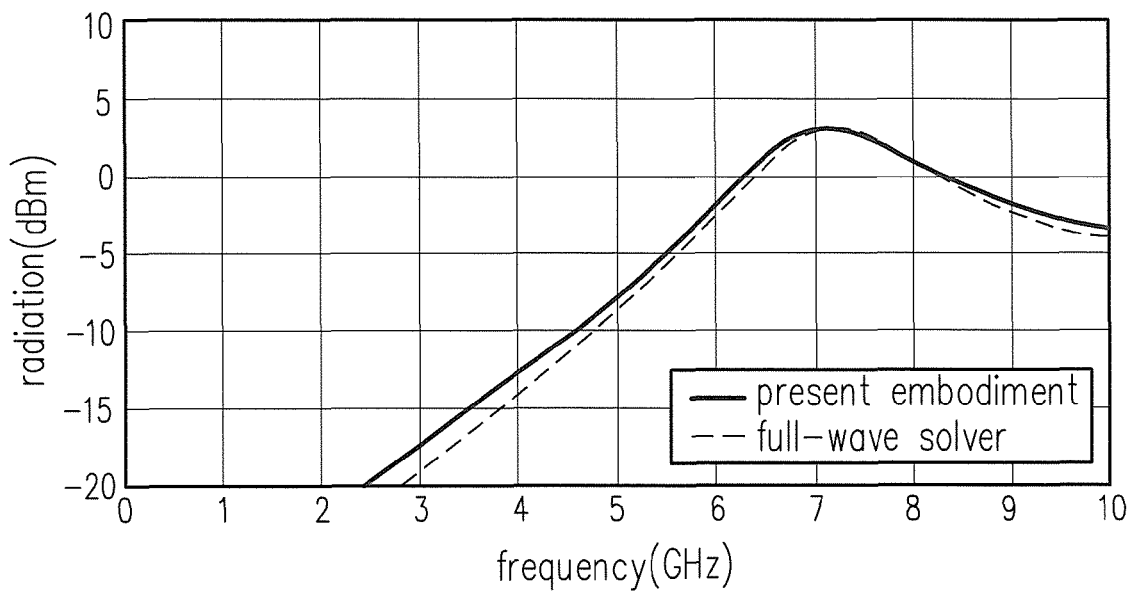
FIG. 11 illustrates a schematic diagram of a total radiated power according to an embodiment of the invention.

The antenna 900 may be divided into a plurality of parts based on the aforesaid approach to construct each corresponding equivalent circuit unit and an equivalent circuit model. The electromagnetic radiation characteristics of the antenna 900 may be predicted based on the approach illustrated in FIG. 1. FIG. 11 illustrates a schematic diagram of a total radiated power of the antenna according to another embodiment of the invention, where prediction results of the method in FIG. 1 and the conventional electromagnetic full-wave solver are given. As illustrated in FIG. 11, the two prediction results are fairly close.

A computer-readable recording medium is also provided based on the aforesaid embodiments of the invention. Such recoding medium may record a computer program. When an electronic device such as a computer loads and executes the computer program, the method for predicting electromagnetic radiation characteristics as illustrated in the embodiment of FIG. 1 may be performed.

Figure 12:
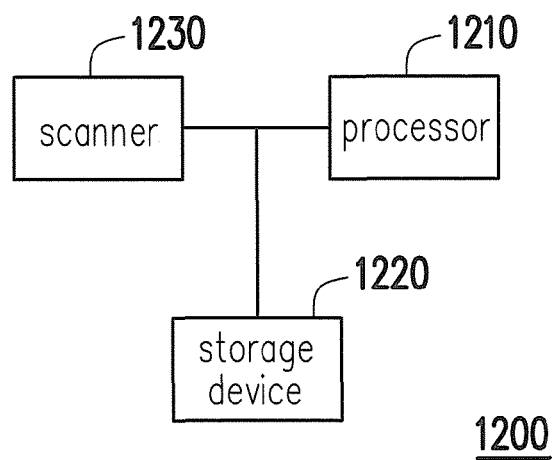
FIG. 12 illustrates a schematic diagram of a simulator according to an embodiment of the invention.

FIG. 12 illustrates a schematic diagram of a simulator 1200 according to an embodiment of the invention. The simulator 1200 includes a processor 1210, a storage device 1220, and a scanner 1230 coupled to each other. The processor 1210 may execute the method in FIG. 1. The storage device 1220 may store data for executing the method in FIG. 1 such as the equivalent circuit model in Step 140, the radiation currents in Step 150, the radiance resistance in Step 160, and the radiation currents in Step 180.

The scanner 1230 may be a two-dimensional scanner or a three-dimensional scanner. The scanner 1230 may scan a model of an electronic component so as to obtain appearance features of the electronic component such as its size, shape, or structure. The scanner 1230 may enlarge or shrink the scanned appearance features according to a preset zooming factor. The processor 1210 may execute the method in FIG. 1 according to the appearance features provided by the scanner 1230 to predict electromagnetic radiation characteristics of the electronic component corresponding to the aforesaid model. This allows electromagnetic radiation characteristics of an electronic component to be predicted prior to manufacturing the actual electronic component.

In summary, the invention is able to construct an equivalent circuit model compatible with circuit analysis software for an electronic component, and such model also describes electromagnetic radiation characteristics of the electronic component. The invention overcomes the incapability of considering the electromagnetic radiation characteristics in conventional equivalent circuit models. Moreover, the electromagnetic radiation characteristics of the electronic component, including the total radiated power and the radiation pattern, may be efficiently predicted. No electromagnetic full-wave solver is needed, and cumbersome calculations may be greatly reduced. The invention is applicable to any circuit, any electronic component, and any electronic device composed by any conductor.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for predicting electromagnetic radiation characteristics, comprising:
    obtaining a plurality of first radiation currents in an equivalent circuit model of an electronic component;
    calculating a radiance resistance according to the first radiation currents;
    inserting the radiation resistance into the equivalent circuit model, and then obtaining a plurality of second radiation currents in the equivalent circuit model; and
    predicting electromagnetic radiation characteristics of the electronic component according to the second radiation currents.

2. The method according to claim 1, further comprising:
    dividing the electronic component into a plurality of parts;
    for each of the parts, obtaining an equivalent inductance and an equivalent capacitance with a zero potential at infinity, and constructing an equivalent circuit unit of the part according to the equivalent inductance and the equivalent capacitance; and
    constructing the equivalent circuit model based on the equivalent circuit units of the parts.

3. The method according to claim 2, wherein a size of each of the parts of the electronic component is a preset proportion of a guide wavelength corresponding to a maximum operating frequency of the electronic component.

4. The method according to claim 1, wherein the step of calculating the radiance resistance comprises:
    selecting one of the first radiation currents, wherein all current values of the selected first radiation current within an operating frequency range of the electronic component are greater than zero; and
    calculating the radiation resistance according to the selected first radiation current.

5. The method of claim 4, wherein the step of calculating the radiation resistance further comprises:
    calculating a total radiated power of the electronic component according to the first radiation currents; and
    calculating the radiation resistance according to the selected first radiation current and the total radiated power.

6. The method of claim 5, wherein the step of calculating the total radiated power comprises:
    calculating a magnetic potential of the electronic component according to the first radiation currents;
    calculating an electric field of the electronic component according to the magnetic potential; and
    calculating the total radiated power according to the electric field.

7. The method according to claim 4, wherein the step of inserting the radiation resistance into the equivalent circuit model comprises:
    inserting the radiance resistance at a location in the equivalent circuit model where the selected first radiation current is obtained.

8. The method of claim 1, wherein the electromagnetic radiation characteristics comprises at least one of a total radiated power and a radiation pattern of the electronic component.

9. The method of claim 8, wherein the step of predicting the electromagnetic radiation characteristics comprises:
    calculating a magnetic potential of the electronic component according to the second radiation currents;
    calculating an electric field of the electronic component according to the magnetic potential;
    predicting the radiation pattern according to the electric field; and
    calculating the total radiated power according to the electric field.

10. A non-transitory computer-readable recording medium, storing a computer program, wherein when an electronic device loads and executes the computer program, the method for predicting electromagnetic radiation characteristics as claimed in claim 1 is performed.

11. A simulator, comprising:
    a processor, obtaining a plurality of first radiation currents in an equivalent circuit model of an electronic component, calculating a radiance resistance according to the first radiation currents, inserting the radiation resistance into the equivalent circuit model and then obtaining a plurality of second radiation currents in the equivalent circuit model, and predicting electromagnetic radiation characteristics of the electronic component according to the second radiation currents; and
    a storage device, coupled to the processor, storing the equivalent circuit model, the first radiation currents, the radiation resistance, and the second radiation currents.

12. The simulator in claim 11, wherein the processor divides the electronic component into a plurality of parts, wherein for each of the parts, the processor obtains an equivalent inductance and an equivalent capacitance with a zero potential at infinity and then constructs an equivalent circuit unit of the part according to the equivalent inductance and the equivalent capacitance, and wherein the processor constructs the equivalent circuit model based on the equivalent circuit units of the parts.

13. The simulator of claim 12, wherein a size of each of the parts of the electronic component is a preset proportion of a guide wavelength corresponding to a maximum operating frequency of the electronic component.

14. The simulator of claim 11, wherein the processor selects one of the first radiation currents and calculates the radiation resistance according to the selected first radiation current, and wherein all current values of the selected first radiation current within an operating frequency range of the electronic component are greater than zero.

15. The simulator of claim 14, wherein the processor calculates a total radiated power of the electronic component according to the first radiation currents and calculates the radiation resistance according to the selected first radiation current and the total radiated power.

16. The simulator of claim 15, wherein the processor calculates a magnetic potential of the electronic component according to the first radiation currents, calculates an electric field of the electronic component according to the magnetic potential, and calculates the total radiated power according to the electric field.

17. The simulator of claim 14, wherein the processor inserts the radiance resistance at a location in the equivalent circuit model where the selected first radiation current is obtained.

18. The simulator of claim 11, wherein the electromagnetic radiation characteristics comprises at least one of a total radiated power and a radiation pattern of the electronic component.

19. The simulator of claim 18, wherein the processor calculates a magnetic potential of the electronic component according to the second radiation currents, calculates an electric field of the electronic component according to the magnetic potential, predicts the radiation pattern according to the electric field, and calculates the total radiated power according to the electric field.

* * * * *